(12) United States Patent
Lin

(10) Patent No.: US 6,308,773 B2
(45) Date of Patent: Oct. 30, 2001

(54) HEAT SINK AND FAN ARRANGEMENT

(75) Inventor: Shih-Jen Lin, Taipei (TW)

(73) Assignee: Global WIN Technology Co., Ltd., Taipei (TW)

( * ) Notice: Subject to any disclaimer, the term of this patent is extended or adjusted under 35 U.S.C. 154(b) by 0 days.

(21) Appl. No.: 09/754,305

(22) Filed: Jan. 5, 2001

(30) Foreign Application Priority Data

Jan. 25, 2000 (TW) ............................................. 089201265

(51) Int. Cl.[7] ...................................................... H05K 7/20
(52) U.S. Cl. ........................ 165/80.3; 361/697; 361/704
(58) Field of Search .................................. 165/80.3, 185; 361/704, 697; 174/16.3; 257/718, 719, 722

(56) References Cited

U.S. PATENT DOCUMENTS 5,509,465 * 4/1996 Lai ....................................... 165/80.3
5,678,627 * 10/1997 Lee ...................................... 165/80.3

* cited by examiner

Primary Examiner—Allen Flanigan
(74) Attorney, Agent, or Firm—Bacon & Thomas, PLLC

(57) ABSTRACT

A heat sink and fan arrangement includes a heat sink having two bottom coupling grooves disposed at two opposite lateral sides, a fan supported on the heat sink, the fan having four through holes in four corners of a bottom wall thereof, and two resilient binding wires fastened to the heat sink and the fan to secure the heat sink and the fan together, the binding wires each having a horizontal base portion respectively coupled to the bottom coupling grooves of the heat sink, two hooked tips respectively hooked in the through holes of the fan, and two vertical suspension arms connected between two distal ends of the horizontal base portion and the hooked tips.

3 Claims, 5 Drawing Sheets

HEAT SINK AND FAN ARRANGEMENT

BACKGROUND OF THE INVENTION

The present invention relates to a heat sink and fan arrangement and, more particularly, to such a heat sink and fan arrangement, which uses two U-shaped, hook-tip binding wires to secure the fan to the heat sink.

Various heat sinks have been disclosed for use with a fan to dissipate heat from an electronic device, for example, a CPU (central processing unit). FIG. 6 shows a heat sink and fan arrangement for use to dissipate heat from a CPU. This arrangement comprises a heat sink adapted for attaching to the top sidewall of the CPU, a fan adapted for mounting on the heat sink at the topside, and a fan case adapted for fastening to the CPU to secure the fan, the heat sink and the CPU together. The fan case has bottom hooks adapted for hooking on the bottom sidewall of the CPU. This arrangement is functional, however the manufacturing cost of the fan case is high. Further, the fan case fits only a particular model of CPU.

SUMMARY OF THE INVENTION

The present invention has been accomplished to provide a heat sink and fan arrangement, which eliminates the aforesaid drawbacks. It is one object of the present invention to provide a heat sink and fan arrangement, which is inexpensive to manufacture. It is another object of the present invention to provide a heat sink and fan arrangement, which fits any of a variety of electronic devices. According to the present invention, two resilient binding wires are used and hooked in four through holes in four corners of the fan to secure the fan to the heat sink.

DETAILED DESCRIPTION OF THE PREFERRED EMBODIMENT

Figure 1:
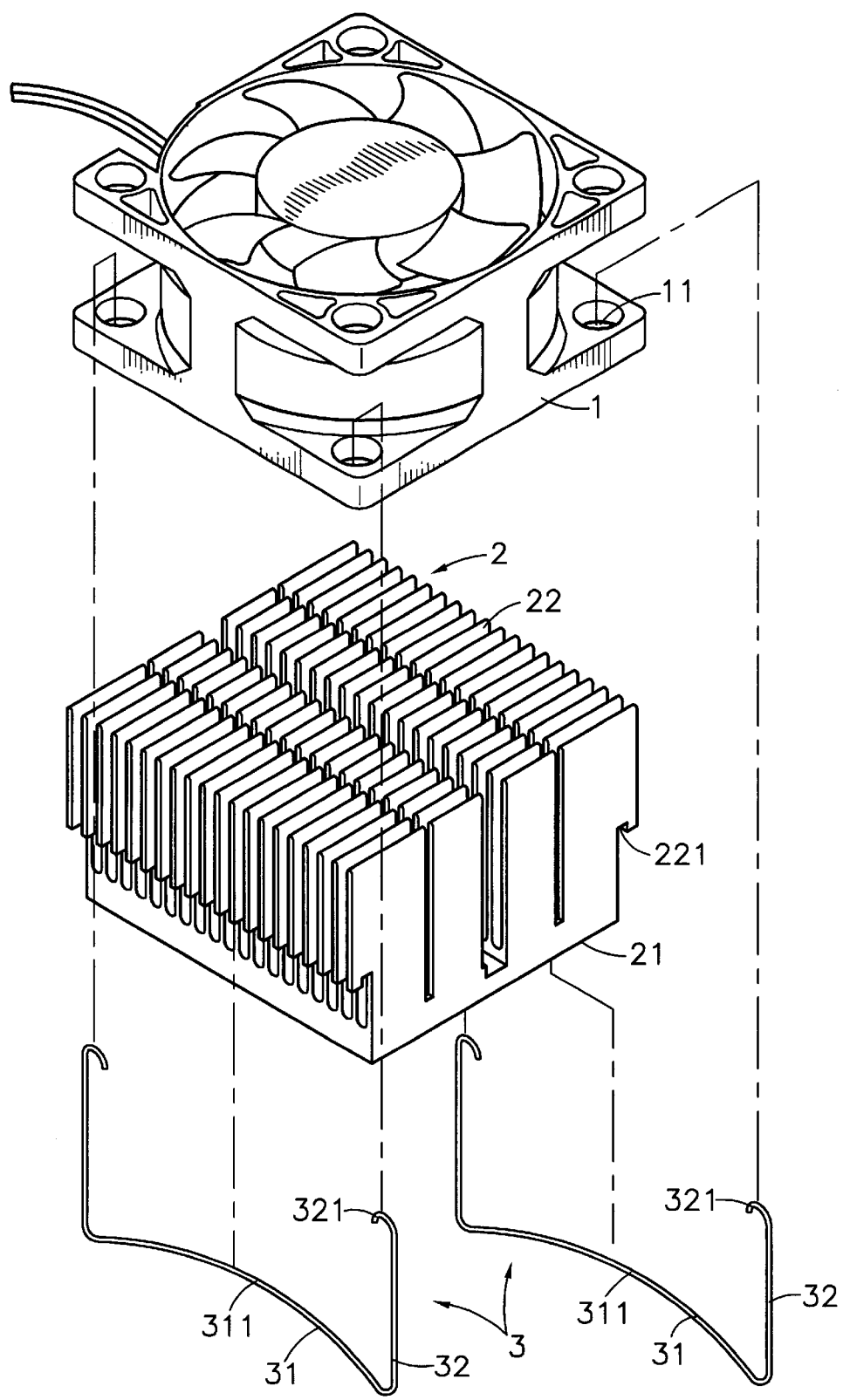
FIG. 1 is an exploded view of a heat sink and fan arrangement according to the present invention.
Figure 2:
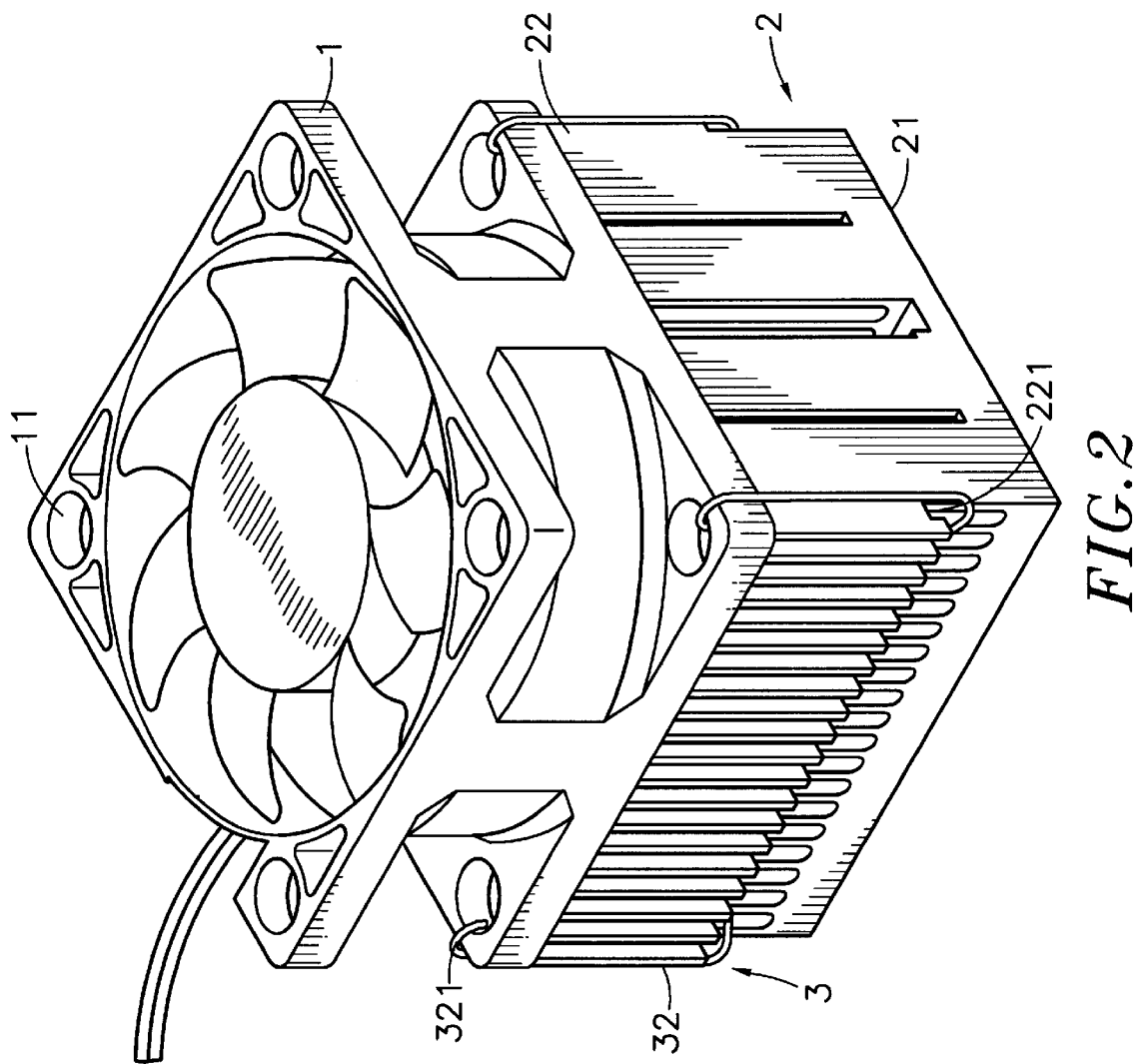
FIG. 2 is an elevational assembly view of the heat sink and fan arrangement of the present invention.

Referring to FIGS. 1 and 2, a heat sink and fan arrangement in accordance with the present invention is generally comprised of a fan 1, a heat sink 2, and two resilient binding wires 3.

The fan 1 has four through holes 11 in four corners of the bottom sidewall thereof. The heat sink 2 comprises a flat bottom contact wall 21 adapted for attaching to, for example, a CPU (central processing unit), and rows of upright radiating fins 22 raised from the top of the flat bottom contact wall 21. The two opposite lateral side rows of upright radiating fins 22 define a respective bottom coupling grooves 221. The resilient binding wires 3 each comprise a horizontal base portion 31, two hooked tips 321, and two vertical suspension arm portions 32 respectively connected between two distal ends of the horizontal base portion 31 and the hooked tips 321. The horizontal base portion 31 has a middle part 311 curved upwards.

Figure 3:
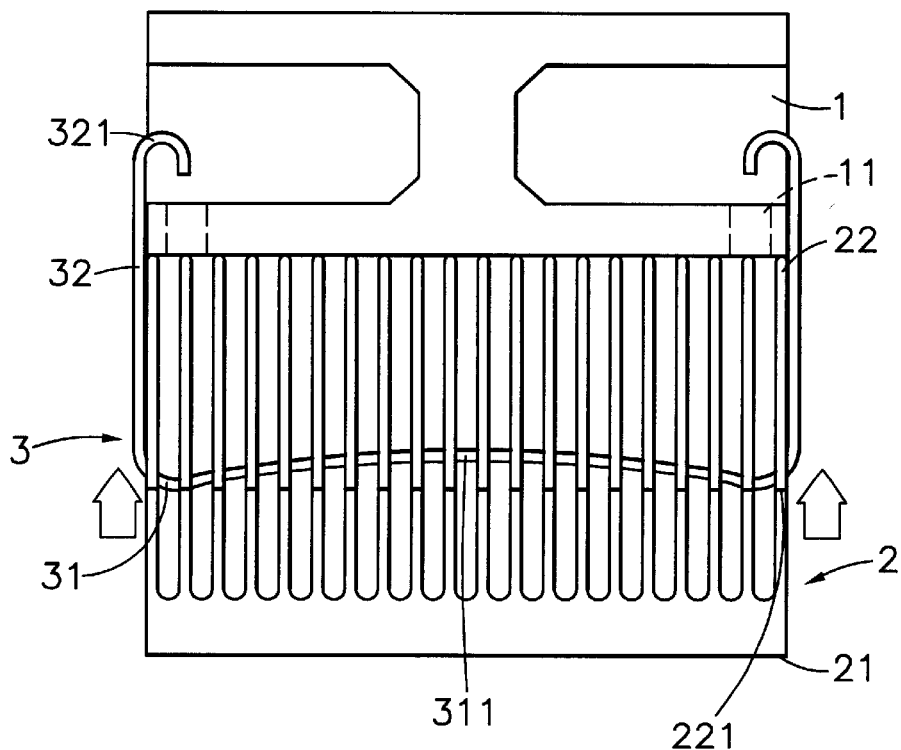
FIG. 3 is a sectional view of the heat sink and fan arrangement showing the fastening of the binding wires according to the present invention.
Figure 4:
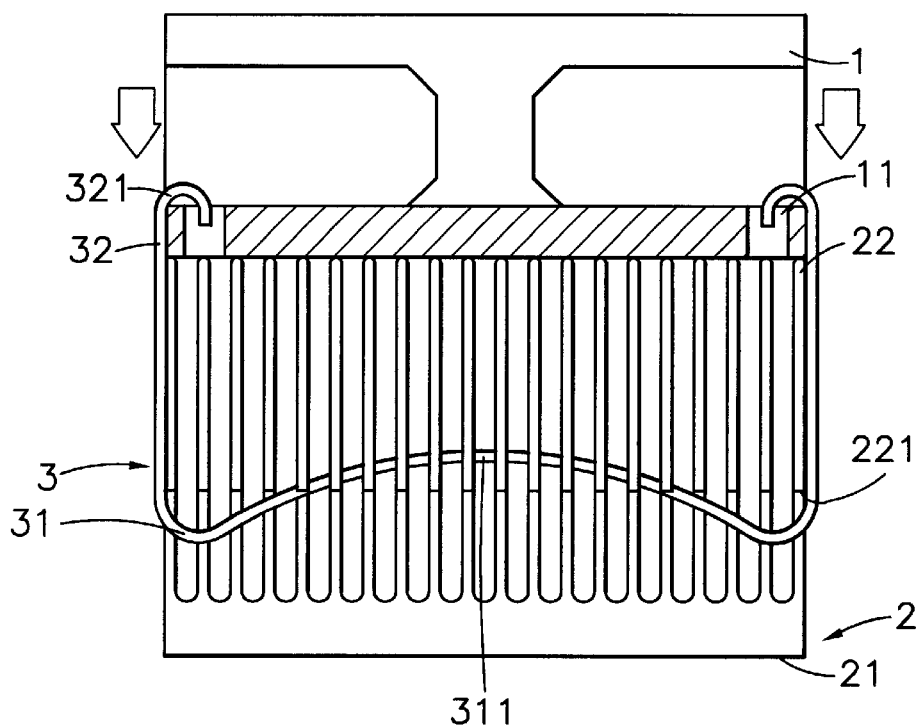
FIG. 4 is a sectional view of the heat sink and fan arrangement showing the binding wires well fastened according to the present invention.

Referring to FIG. 3 and 4 and FIG. 2 again, the fan 1 is attached to the radiating fins 22 of the heat sink 2 at the top side, and then the horizontal base portions 31 of the binding wires 3 are respectively attached to the coupling grooves 221 of the heat sink 2 for enabling the hooked tips 321 of the binding wires 3 to be respectively hooked in the through holes 11 of the fan 1 from the top side.

Referring to FIGS. from 2 through 4 again, when attaching the horizontal base portions 311 of the binding wires 3 to the coupling grooves 221 of the heat sink 2, the upwardly curved middle part 311 of each binding wire 3 is deformed to lift the suspension arms 32 over the elevation of the through holes 11 of the fan 1, so that when the upward pulling force is released from the binding wires 3, the binding wires 3 immediately return to their former shape, thereby causing the hooked tips 321 of the binding wires 3 to be respectively hooked in the through holes 11 of the fan 1 to secure the fan 1 and the heat sink 2 firmly together.

Figure 5:
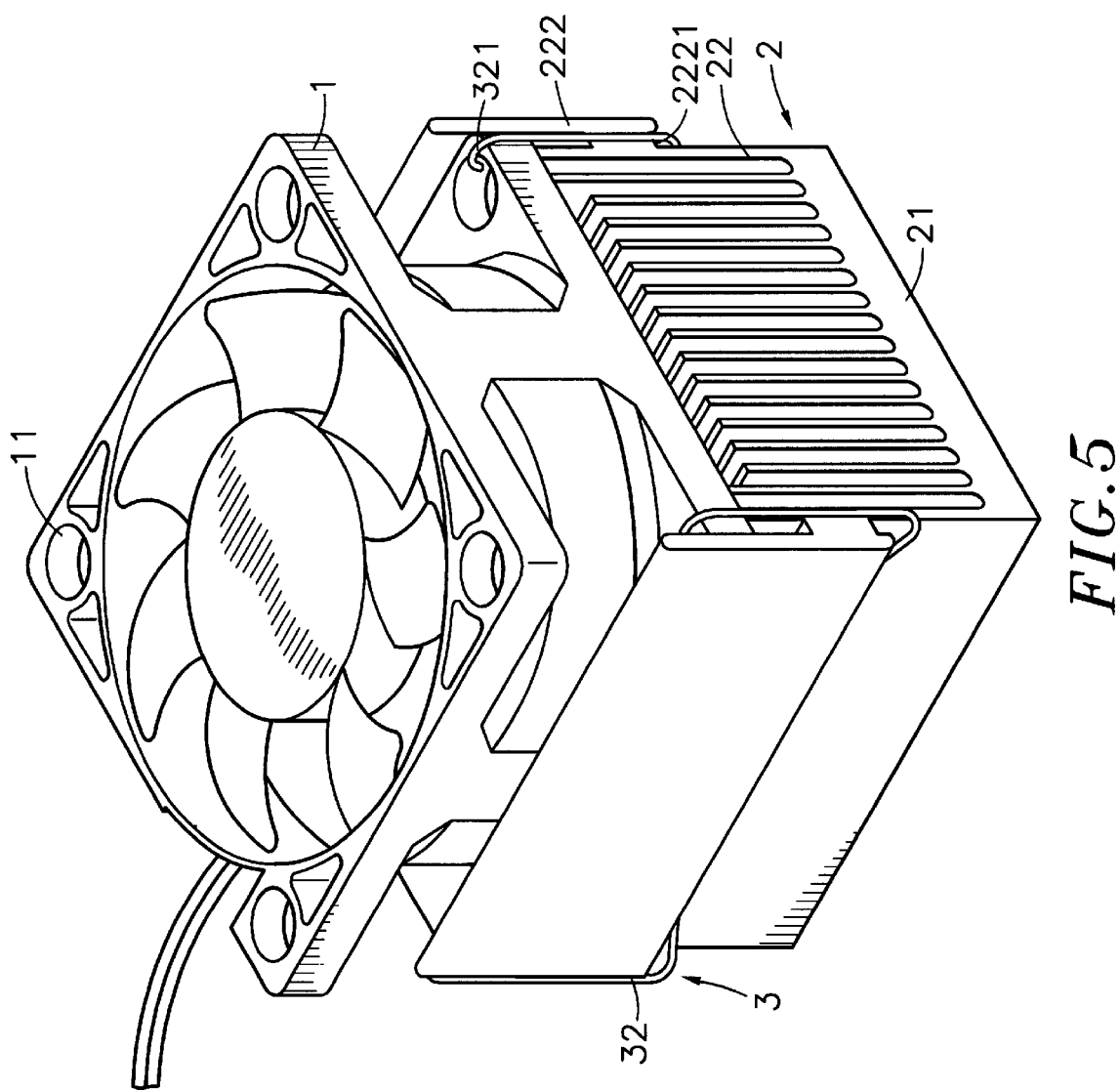
FIG. 5 is an elevational assembly view of an alternate form of the heat sink and fan arrangement according to the present invention.
Figure 6:
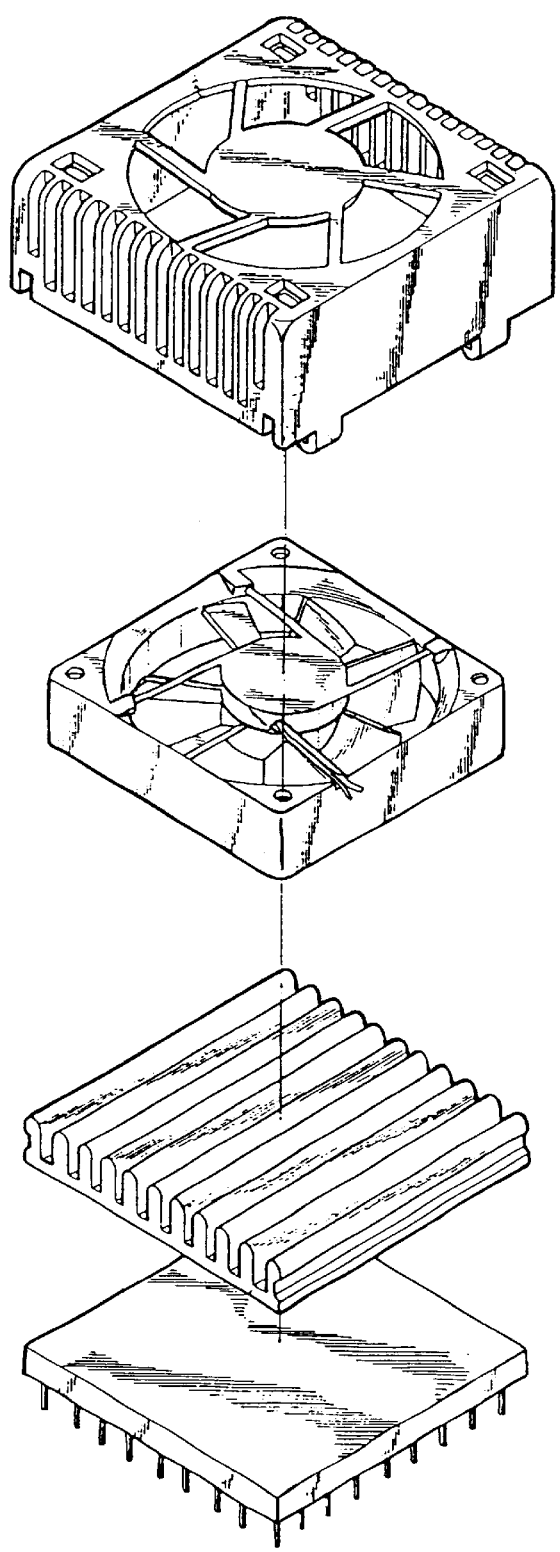
FIG. 6 is an exploded view of the prior art design.

FIG. 5 shows an alternate form of the present invention. According to this alternate form, the heat sink 2 comprises two extension walls 222 vertically disposed at two opposite lateral sides and respectively stopped at two sides of the fan 1. The side extension walls 222 each have a bottom coupling groove 2221 adapted to receive the horizontal base portions 31 of the binding wires 3.

It is to be understood that the drawings are designed for purposes of illustration only, and are not intended for use as a definition of the limits and scope of the invention disclosed.

What the invention claimed is:

1. A heat sink and fan arrangement comprising a heat sink, a fan attached to a top side of said heat sink, and two resilient binding wires fastened to said heat sink and said fan to secure said heat sink and said fan together, wherein said fan comprises four through holes in four corners of a bottom wall thereof; said heat sink comprises two bottom coupling grooves disposed at two opposite lateral sides; said resilient binding wires each comprise a horizontal base portion respectively coupled to the bottom coupling grooves of said heat sink, two hooked tips respectively hooked in the through holes of said fan, and two vertical suspension arms connected between two distal ends of said horizontal base portion and said hooked tips.

2. The heat sink and fan arrangement of claim 1, wherein said heat sink comprises two extension walls vertically disposed at two opposite lateral sides, and said bottom coupling grooves are respectively formed on said extension walls at a bottom side.

3. The heat sink and fan arrangement of claim 2, wherein said extension walls of said heat sink are respectively stopped at two opposite lateral sides of said fan.

* * * * *